(12) United States Patent
Watanabe

(10) Patent No.: US 10,862,499 B2
(45) Date of Patent: Dec. 8, 2020

(54) A/D CONVERTER CIRCUIT

(71) Applicant: DENSO CORPORATION, Kariya (JP)

(72) Inventor: Takamoto Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/785,854

(22) Filed: Feb. 10, 2020

(65) Prior Publication Data

US 2020/0177197 A1 Jun. 4, 2020

Related U.S. Application Data

(63) Continuation of application No. PCT/JP2018/037220, filed on Oct. 4, 2018.

(30) Foreign Application Priority Data

Oct. 4, 2017 (JP) .................................. 2017-194565

(51) Int. Cl.
*H03M 1/50* (2006.01)
*H03M 1/60* (2006.01)

(52) U.S. Cl.
CPC ............. *H03M 1/502* (2013.01); *H03M 1/60* (2013.01)

(58) Field of Classification Search
CPC .......... H03M 1/502; H03M 1/60; H03M 1/50
USPC ........................................ 341/155, 157, 166
See application file for complete search history.

(56) References Cited

U.S. PATENT DOCUMENTS

| | | | |
|---|---|---|---|
| 5,396,247 A | 3/1995 | Watanabe et al. | |
| 5,416,444 A | 5/1995 | Yamauchi et al. | |
| 5,528,200 A | 6/1996 | Yamauchi et al. | |
| 7,355,544 B2 * | 4/2008 | Watanabe ............... | H03M 1/06 341/155 |
| 9,276,600 B2 * | 3/2016 | Terazawa .............. | H03M 1/109 |
| 2003/0201927 A1 | 10/2003 | Watanabe et al. | |

* cited by examiner

*Primary Examiner* — Khai M Nguyen
(74) *Attorney, Agent, or Firm* — Posz Law Group, PLC

(57) ABSTRACT

An A/D converter circuit that converts analog information to numerical data is provided with a pulse delay circuit and an output unit. A sampling period is set so that a relationship between the sampling period and a circulation period of a pulse signal passing through a ring delay circuit satisfies a relational expression $Trdl \times n < Ts \leq Trdl \times (n+1)$. In the relational expression, Ts is the sampling period, Trdl is the circulation period in which the pulse signal circulates through the pulse delay circuit, and "n" is an integer equal to or greater than 0.

4 Claims, 6 Drawing Sheets

A/D CONVERTER CIRCUIT

CROSS REFERENCE TO RELATED APPLICATION

The present application is a continuation application of International Patent Application No. PCT/JP2018/037220 filed on Oct. 4, 2018, which designated the United States and claims the benefit of priority from Japanese Patent Application No 2017-194565 filed on Oct. 4, 2017. The entire disclosures of all of the above applications are incorporated herein by reference.

FIELD

The present disclosure relates to an A/D converter circuit for converting analog information into numerical data.

BACKGROUND

A conventional A/D converter circuit includes a pulse delay circuit and a counter circuit. The pulse delay circuit includes a plurality of delay units connected in series in a ring shape. Each of the plurality of delay units outputs an input pulse signal with a time delay corresponding to an analog input signal. The pulse delay circuit receives an analog input signal as a power supply voltage and circulates the received pulse signal. The counter circuit counts the number of circulations of the pulse signal in the pulse delay circuit.

The A/D converter circuit acquires the number of circulations of the pulse signal and the position of the pulse signal in the pulse delay circuit at a sampling timing. Then, the A/D converter circuit calculates the number of delay units through which the pulse signal has passed during a sampling cycle period based on the acquired number of circulations and converts the analog input signal into numerical data corresponding to the calculated number of passing.

SUMMARY

An A/D converter circuit for converting analog information into numerical data comprises a pulse delay circuit an output unit. The pulse delay circuit is formed of a plurality of delay units connected in series in a ring shape. Each of the plurality of delay units delays a pulse signal by time in correspondence to the analog information. The output unit is configured to output at every sampling period, numerical data corresponding to a number of the delay units, through which the pulse signal has passed during the sampling period. The sampling period is set so that a relationship between the sampling period and a circulation period of the pulse signal required to circulate the delay circuit satisfies a predetermined relational expression.

DETAILED DESCRIPTION OF THE EMBODIMENT

Hereinafter, exemplary embodiments for implementing an A/D converter circuit according to the present disclosure will be described with reference to the drawings.

First Embodiment

<Overall Configuration>

Figure 1:
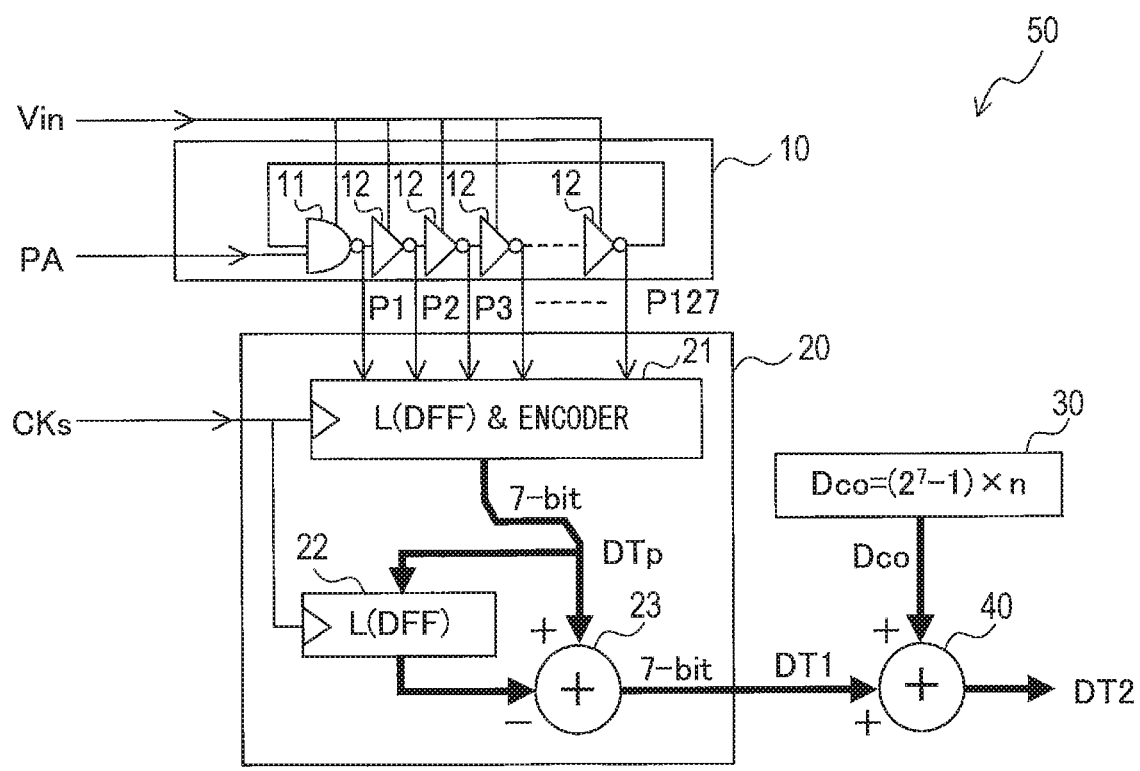
FIG. 1 is a block diagram illustrating a configuration of an A/D converter circuit according to a first embodiment.

First, an overall configuration of an analog-to-digital conversion circuit 50 (hereinafter referred to as an A/D converter circuit 50) of the present embodiment will be described with reference to FIG. 1. The A/D converter circuit 50 is configured to convert an analog input signal Vin into numerical data as digital data and outputs it. In the present embodiment, the analog input signal Vin is assumed to be a voltage potential. The A/D converter circuit 50 includes a ring delay line 10, an encoding circuit 20, a circulation number calculation unit 30 and an adder 40.

The ring delay line 10 includes a plurality of delay units connected in series in a ring shape. In the present embodiment, the number of the plurality of delay units is $2^m-1$.

Here, "m" is a natural number. Specifically, in the present embodiment, the number of delay units is $2^7-1$ (=127).

Figure 2:
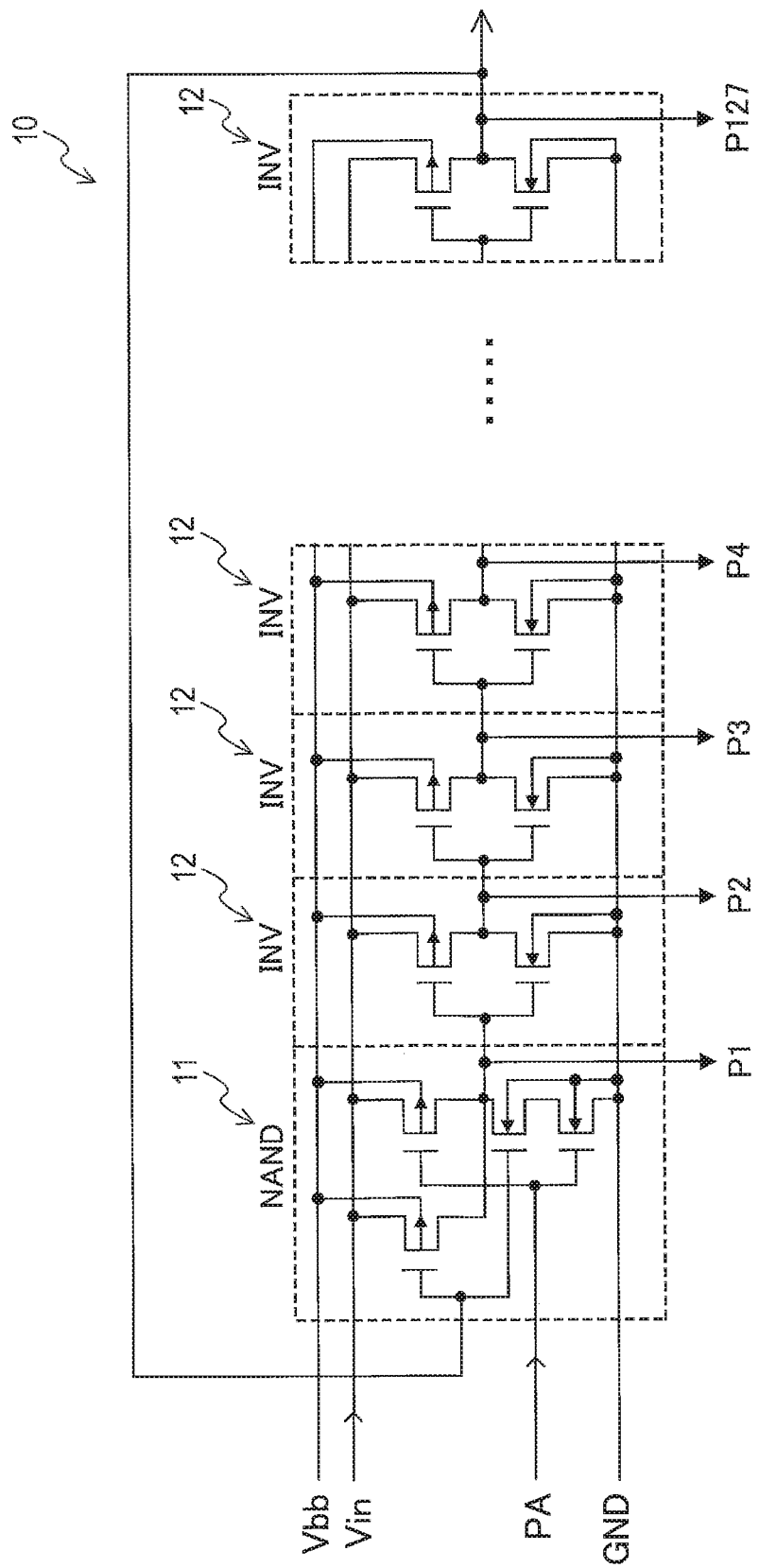
FIG. 2 is a circuit diagram showing an example of a ring delay line.

As shown in detail in FIG. 2, the ring delay line 10 includes one NAND circuit 11 and 126 inverter circuits 12 as the plurality of delay units. The ring delay line 10 is configured by connecting one NAND circuit 11 and 126 inverter circuits 12 in series and in the ring shape, and functions as a time A/D converter circuit.

The inverter circuit 12 and the NAND circuit 11 are, for example, CMOS gate circuits having PMOS field effect transistors (hereinafter referred to as PMOSFETs) and NMOS field effect transistors (hereinafter referred to as NMOSFETs). A bias power supply Vbb is applied to a back gate bias of the PMOSFET of each delay unit 11, 12. Further, the analog input signal Vin is applied to a positive power supply terminal of each delay unit 11, 12 as a drive power supply, and the ground is connected to a negative power supply terminal of each delay unit 11, 12. Further, a transmission pulse signal PA is input to an input terminal of the NAND circuit 11. When the pulse signal PA input to the NAND circuit 11 changes from a low level to a high level, the ring delay line 10 starts to operate and the pulse signal PA circulates through the ring delay line 10. Since the number of the delay units 11 and 12 is an odd number, the pulse signal PA continues to circulate without stopping.

Each delay unit 11, 12 transmits the pulse signal PA while delaying the pulse signal PA by a time corresponding to an inter-terminal voltage between the positive and negative terminals, that is, a time corresponding to the analog input signal Vin. That is, the ring delay line 10 is configured such that the number of delay units 11 and 12 through which the pulse signal PA passes during a predetermined period is the number corresponding to a magnitude of the potential that is the analog input signal Vin. Therefore, the analog input signal Vin can be converted into numerical data by digitizing the number of circulations of the pulse signal PA through the delay units 11 and 12 in the predetermined period. In the present embodiment, the ring delay line 10 corresponds to a pulse delay circuit.

The encoding circuit 20 includes a latch and encoder 21, a latch circuit 22, and an adder 23. The adder 23 is referred to as a first adder and the adder 40 is referred to as a second adder in the following description. The latch and encoder 21 receives outputs P1 to P127 of the 127 delay units 11 and 12 at the sampling timing which is the rise or fall timing of a sampling clock CKs. Then, the encoding circuit 20 generates 7-bit position data DTp corresponding to the position of the pulse signal PA in the ring delay line 10. That is, the latch and encoder 21 repeatedly digitizes the position of the pulse signal PA in the ring delay line 10 for each sampling period Ts. Then, the latch and encoder 21 outputs generated position data DTp to each of the latch circuit 22 and the first adder 23.

The latch circuit 22 holds the latest position data DTp output from the latch and encoder 21 and outputs the position data DTp held immediately before the latest position data DTp to the first adder 23 as a comparison value.

The first adder 23 subtracts the comparison value from the latest position data DTp to generate 7-bit deviation data DT1. That is, the first adder 23 calculates a deviation between the position of the pulse signal PA that is quantified at the preceding sampling timing and the position of the pulse signal PA that is quantified at the present sampling timing. Then, the first adder 23 outputs generated deviation data DT1 to the second adder 40.

The circulation number calculation unit 30 calculates an addition value Dco and outputs a calculated addition value Dco to the second adder 40. The addition value Dco is a product of multiplication of the number of circulations of the pulse signal PA in the sampling period Ts by the number of delay units. The calculation of the addition value Dco will be described later in detail.

The second adder 40 adds the addition value Dco to the deviation data DT1 to generate numerical data DT2. The numerical data DT2 is digital data representing the number of passing the delay units 11 and 12 through which the pulse signal PA has passed during the sampling period Ts.

Here, the first adder 23 performs subtraction using a complement in a binary number. However, since the number of the delay units is less by 1 than $2^m$, a code increase may occur in case the first adder 23 performs the subtraction. The code increase is a phenomenon where the value becomes greater than a correct value. Therefore, in case the code increase occurs, it is necessary to correct the numerical data DT2. However, even in case the code increase occurs, the increment for the correct value is only 1. Therefore, in case the number of delay units is $2^m-1$, the correction is easier in comparison to a case where the number of delay units is $2^m-3$, $2^m-5$ and the like.

In the present embodiment, the encoding circuit 20, the circulation number calculation unit 30 and the second adder 40 correspond to an output unit. In the present embodiment, the encoding circuit 20 corresponds to a deviation calculation unit, and the second adder 40 corresponds to a generation unit.

<Calculation of Circulation Number of Pulse Signal>

Figure 5:
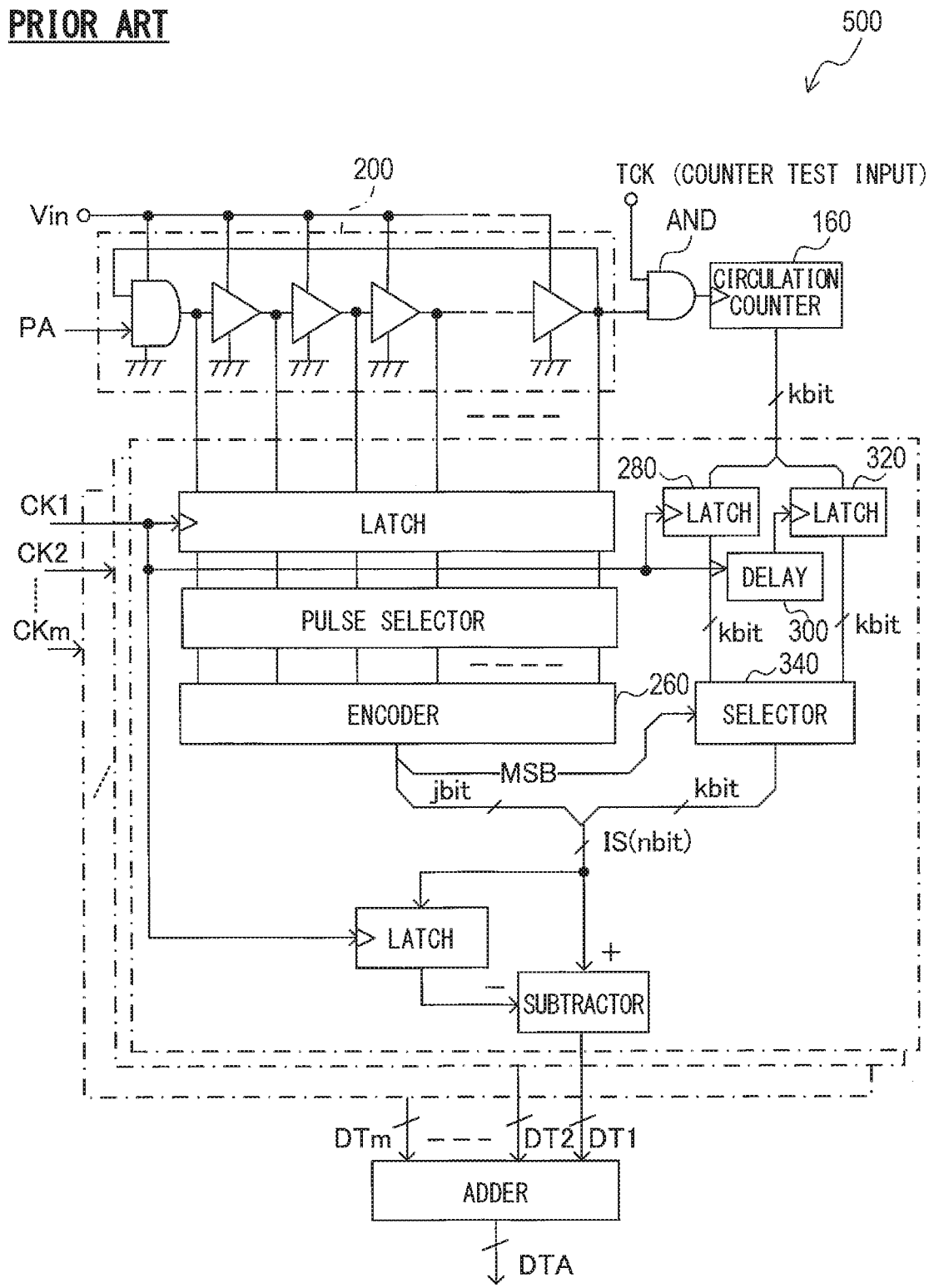
FIG. 5 is a block diagram showing a configuration of a conventional A/D converter circuit.
Figure 6:
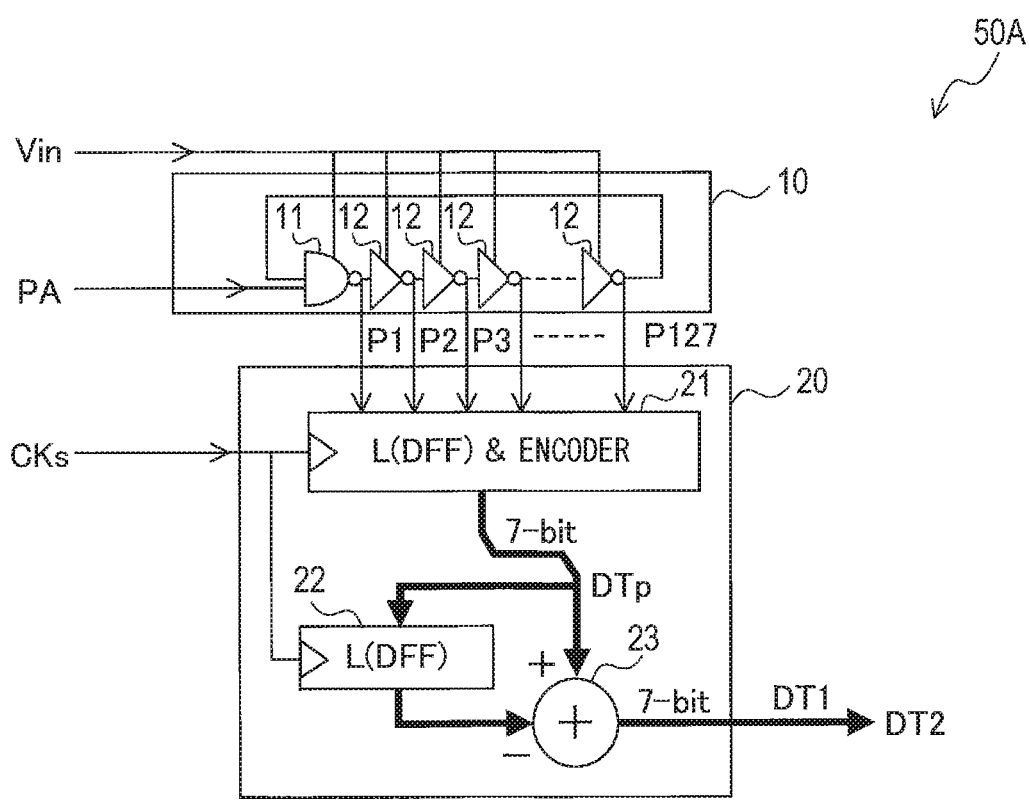
FIG. 6 is a block diagram illustrating a configuration of an A/D converter circuit according to a second embodiment.

Next, a method for calculating the circulation number of the pulse signal PA will be described. FIG. 5 shows a conventional A/D converter circuit 500. The A/D converter circuit 500 includes a circulation number counter circuit 160. The circulation number counter circuit 160 counts the number of circulations that a pulse signal PA circulates a ring delay line 200. The A/D converter circuit 500 generates data IS using position data of the pulse signal PA in the ring delay line 200 calculated by an encoder 260 as lower bit data (least significant side data) and using a circulation number counted by the circulation number counter circuit 160 as upper bit data (most significant side data). The A/D converter circuit 500 calculates a deviation between the data IS at a present sampling timing and the data IS at a preceding sampling timing, and outputs this deviation as numerical data.

Since the conventional A/D converter circuit 500 includes the circulation number counter circuit 160, the circuit scale increases and the power consumption increases. Further, since the output timing and the sampling timing of the circulation number counter circuit 160 are not synchronized, the A/D converter circuit 500 is provided with latch circuits 280, 320, a delay line 300 and a selector 340 so as not to use the count value latched in a state where the value is unstable.

The latch circuit 280 latches the output of the circulation number counter circuit 160 at the sampling timing. The latch circuit 320 latches the output of the circulation number counter circuit 160 at a timing delayed by a half cycle period of the sampling period Ts by the delay line 300. In case that the value of the most significant bit of the output of the encoder 260 is 1, that is, when the pulse signal PA is located in a latter half stage of the delay unit, the output of the circulation number counter circuit 160 is stable and hence the selector 340 selects the output of the latch circuit 280. In case that the value of the most significant bit of the output of the encoder 260 is 0, that is, when the pulse signal PA is located in a former half stage of the delay unit, the selector 340 selects the output of the latch circuit 320. As described above, since the A/D converter circuit 500 is provided with a circuit for countermeasures against metastability, the circuit configuration is complicated.

Therefore, the A/D converter circuit 50 of the present embodiment is provided with no circulation number counter circuit. In addition, the sampling period Ts is set to satisfy a relationship expressed as follows.

$$\text{Trdl} \times n < Ts \leq \text{Trdl} \times (n+1) \qquad [\text{I}]$$

In this relational expression [I], "n" is an integer greater than or equal to 0, and Trdl is a circulation period in which the pulse signal PA circulates the ring delay line 10. That is, the circulation period Trdl is a time required for the pulse signal PA to make one circulation through the ring delay line 10.

The circulation period Trdl changes according to the analog input signal Vin. Specifically, the circulation period Trdl is shorter as the analog input signal Vin is greater. In the present embodiment, the analog input signal Vin takes a value within a predetermined range. The sampling period Ts is set so as to satisfy the relational expression [I] whatever value the analog input signal Vin becomes within the predetermined range, in case that "n" is set to a predetermined value. That is, the sampling period Ts satisfies the relational expression Ts≤Trdl×(n+1) even in case that the analog input signal Vin has a maximum value within a predetermined range, and satisfies the relational expression Trdl×n<s even in case that the analog input signal Vin has a minimum value within the predetermined range. Further, the resolution of the numerical data DT2 is higher as the value of "n" is greater. Therefore, the value of "n" is set according to the required resolution of the numerical data DT2.

Figure 3:
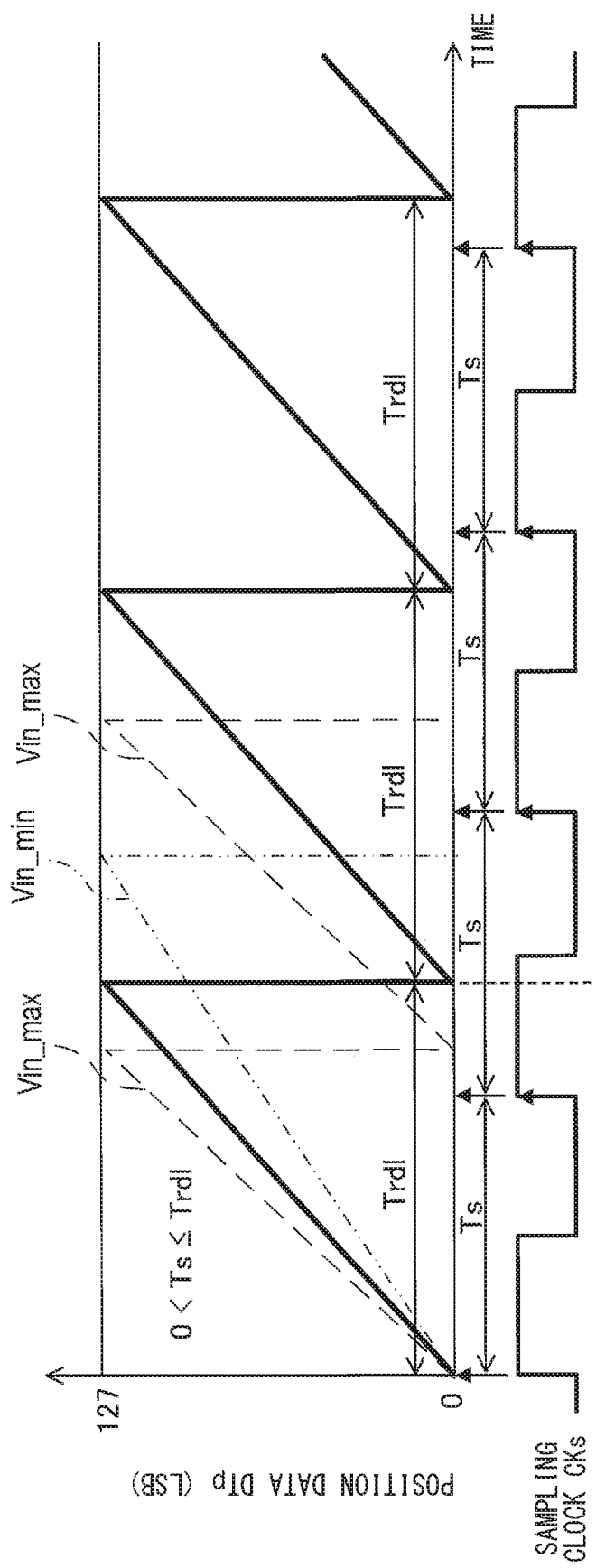
FIG. 3 is an example of a time chart of position data of a pulse signal in the ring delay line and a sampling clock.
Figure 4:
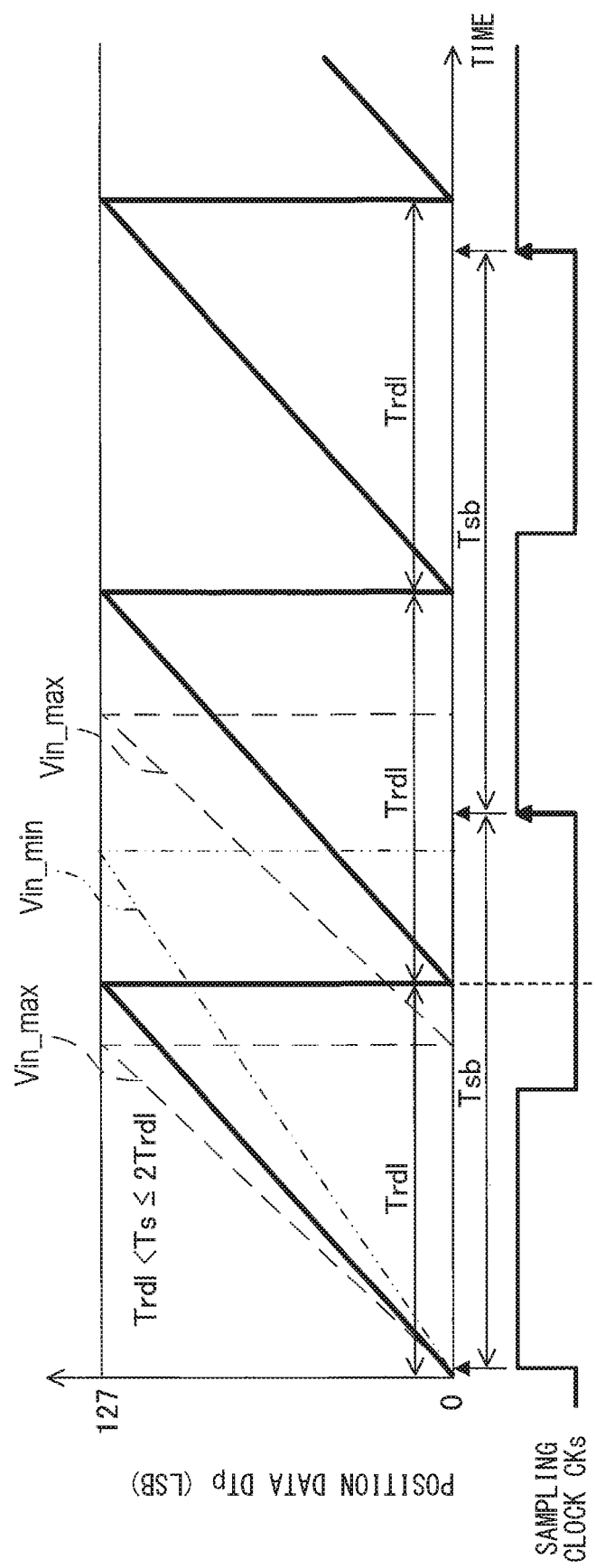
FIG. 4 is another example of the position data of the pulse signal in the ring delay line and the sampling clock.

FIG. 3 shows, in case of "n"=0, a time chart of the position data DTp and the sampling clock and a relationship between the sampling period Ts and the circulation period Trdl. In FIG. 3 and FIG. 4, the position data DTp in case of the analog input signal Vin being the maximum value and the minimum value within the predetermined range is indicated by a broken line and a chain line, respectively. In case of "n"=0, the sampling period Ts is set so as to satisfy the relational expression of 0<Ts≤Trdl when the analog input signal Vin changes within the predetermined range. The position data DTp monotonously increases to the 127th delay unit 12 as time passes, and returns to 0 when it reaches the 127th delay unit 12. The circulation period Trdl is a time required for the position data DTp to increase from 0 to 127. Then, sampling is performed at a timing indicated by an arrow in FIG. 3. In case of "n"=0, the number of the delay units 11 and 12 through which the pulse signal PA passes is 127 or less during the sampling period Ts. In this case, the deviation data DT1 equals numerical value data DT2.

FIG. 4 shows, in case of "n"=1, a time chart of the position data DTp and the sampling clock and a relationship between the sampling period Ts and the circulation period Trdl. In case of "n"=1, the sampling period Ts is set so as to satisfy the relational expression of Trdl<Ts≤Trdl when the analog input signal Vin changes within the predetermined range. In case of "n"=1, the number of circulating the delay units 11 and 12 through which the pulse signal PA passes within the sampling period Ts is greater than 127 and less than or equal to 254. In this case, the number of circulations of the pulse signal PA within the sampling period Ts is 1, and the numerical data DT2 is the deviation data DT1+127.

In case of "n"≥2, the addition value Dco is calculated in the same manner as "n"=0 or 1. That is, in case the sampling period Ts is set to satisfy the relational expression [I], the number of circulations of the pulse signal PA within the sampling period Ts is n. Therefore, the circulation number calculation unit 30 may calculate $(2^m-1) \times n$ as the addition value Dco. The numerical data DT2 equals the deviation data $DT1+(2^m-1) \cdot n$. As a result, the A/D converter circuit 50 can calculate the circulation number of the delay units 11 and 12 through which the pulse signal PA passes within the sampling period Ts, even in case that the A/D converter circuit 50 does not include a circulation number counter.

<Effect>

According to the first embodiment described above, the following effects can be exhibited.

(1) The sampling period Ts is set so that the relationship between the sampling period Ts and the circulation period Trdl satisfies the relational expression [I]. Therefore, the number of circulations that the pulse signal PA circulates in the ring delay line 10 during the sampling period Ts is determined as n, and it is not necessary to count the number of circulations. That is, the A/D converter circuit 50 need not be provided with the counter circuit, which counts the number of circulations, Therefore, the circuit scale of the A/D converter circuit 50 can be suppressed and the power consumption can be reduced.

(2) The value obtained by adding the deviation data DT1 which is the deviation between the preceding value and the current value of the position of the pulse signal PA and the addition value Dco which is the product of the number of delay units 11 and 12 and "n" is the number of delay units 11 and 12 through which the pulse signal PA has passed during the sampling period Ts. Therefore, even in case that the A/D converter circuit 50 does not include a counter circuit, the A/D converter circuit 50 can calculate the circulation number of the pulse signal PA through the delay units 11 and 12 and generate the numerical data DT2 corresponding to the circulation number as in the case of including the counter circuit.

(3) With the analog input signal Vin changing within the predetermined range, the circulation period Trdl changes, and the number of delay units 11 and 12 through which the pulse signal PA passes within the sampling period Ts also changes. The sampling period Ts is set to satisfy the relational expression [I] at the predetermined value "n" even when the circulation period Trdl changes. Therefore, even when the analog input signal Vin changes within the predetermined range, the A/D converter circuit 50 can generate the numerical data DT2 corresponding to the analog input signal Vin by satisfying the relational expression [I] without using the counter circuit.

Second Embodiment

<Difference from First Embodiment>

Since basic configuration of a second embodiment is the same as that of the first embodiment, the description of the common configuration will not be made, and the description will be made on the differences only. It is noted that the same reference numerals as those in the first embodiment indicate the same configuration, and refer to the preceding descriptions.

The A/D converter circuit 50 according to the first embodiment described above is a circuit used by setting "n" to the integer greater than or equal to 0 in the relational expression [1], and includes the circulation number calculation unit 30 and the second adder 40. On the other hand, an A/D converter circuit 50A of the second embodiment is a circuit that is always used by setting "n"=0 in the relational expression [1], and does not include the adder 40.

In the expression [1], in case of "n"=0, the addition value Dco becomes 0 and the deviation data DT1 output from the first adder 23 becomes the numerical data DT2 as described above. Therefore, the A/D converter circuit 50A which always uses n=0 does not include the circulation number calculation unit 30 and the second adder 40. In the present embodiment, the encoding circuit 20 corresponds to the output unit. In the present embodiment, the encoding circuit 20 corresponds to the deviation calculation unit, and the first adder 40 corresponds to the generation unit.

<Effect>

According to the second embodiment described above, the following effects are exhibited in addition to the effects (1) to (3) of the first embodiment described above.

(4) The A/D converter circuit 50A is different from the A/D converter circuit 50 in that the circulation number calculation unit 30 and the second adder 40 are not provided. Therefore, the circuit scale of the A/D converter circuit 50A is further suppressed, and the power consumption is further suppressed.

Other Embodiment

Although embodiments of the present disclosure have been described above, the present disclosure is not limited to the above-described embodiments but various modifications can be made.

(A) In the above embodiments, the number of delay units is but the present disclosure is not limited to such a number. The number of delay units may be $(2^m+1)$. In this case, since the number of delay units is an odd number, the pulse signal PA continues to circulate without stopping. Further, in this case, when the first adder 23 performs subtraction, a code missing whose value is less than a correct value may occur. However, as in the case where the number of delay units is $2^m-1$, the decrease relative to the correct value is only 1. As a result, correction is easily made in comparison to a case that the number of delay units is $2^m+3$ or $2^m+5$.

The number of delay units may be $2^m$. In this case, correction is not necessary because no code increase or code loss occurs in case the first adder 23 performs subtraction. However, in this case, since the number of delay units is an even number, it is necessary to add a NAND circuit or a bypass line to the ring delay line 10 so that the ring delay line 10 becomes stable and the pulse signal PA does not stop. The countermeasures against a case of the even number of delay units may be taken in a conventional manner.

(B) In each of the above embodiments, the A/D converter circuit 50, 50A converts the analog input signal Vin representing the potential into the numerical data. However, the present disclosure is not limited to this. The A/D converter circuit 50, 50A may convert analog information indicating time, temperature, stress and the like into numerical data. In case of converting the analog information indicating time into numerical data, the sampling clock may be input to the A/D converter circuit at a measurement start time and a measurement end time while maintaining Vin, Vbb and GND of the A/D converter circuit 50, 50A constant. In this way, numerical values representing a difference between these times are output from the A/D converter circuit 50, 50A as numerical data. Further, in case of converting the analog information indicating temperature or stress, the numerical data to be obtained when a sampling clock input interval is fixed may be stored in advance for each temperature and stress while maintaining Vin, Vbb and GND of the A/D converter circuit 50, 50A constant. In this way, in case of actually measuring the temperature or the stress, it is possible to determine what temperature and stress the numerical data correspond.

(C) In each of the above embodiments, the A/D converter circuit 50, 50A includes one encoding circuit 20. However, the A/D converter circuit 50, 50A may include a plurality of encoding circuits that performs sampling at different sampling timings as conventionally known in the art. Since the A/D converter circuit 50, 50A includes a plurality of encoding circuits, the resolution of the obtained numerical data is increased.

(D) A plurality of functions of one element in the above embodiments may be implemented by a plurality of elements, or one function of one element may be implemented by a plurality of elements. Further, a plurality of functions of a plurality of elements may be implemented by one element, or one function implemented by a plurality of elements may be implemented by one element. A part of the configuration of the above embodiments may be omitted. At least a part of the configuration of one embodiment may be added to or replaced with the other configuration of the other embodiment.

(E) In addition to the above-described A/D converter circuit, the present disclosure may be realized in various forms, such as a system including the A/D converter circuit as a component, an A/D conversion method and the like.

What is claimed is:

1. An A/D converter circuit for converting analog information into numerical data, comprising:
    a pulse delay circuit formed of a plurality of delay units connected in series in a ring shape, each of plurality of delay units delaying a pulse signal by time in correspondence to the analog information; and
    an output unit configured to output at every sampling period, numerical data corresponding to a number of the delay units, through which the pulse signal has passed during the sampling period,
    wherein the sampling period is set so that a relationship between the sampling period and a circulation period of the pulse signal required to circulate the delay circuit satisfies a relational expression of $Trdl \times n < Ts \leq Trdl \times (n+1)$, in which Ts is the sampling period, Trdl is the circulation period and n is an integer equal to or greater than 0.

2. The A/D converter circuit according to claim 1, wherein:
    a number of the delay units is any one of $2^m-1$, $2^m$ and $2^m+1$ in which "m" is a natural number;
    the output unit includes a deviation calculation unit and a generation unit;
    the deviation calculation unit is configured to digitize a position of the pulse signal in the pulse delay circuit repeatedly at every sampling period, and calculate a deviation between a preceding digitized value and a present digitized value of the pulse signal; and
    the generation unit generates the numerical data by adding an addition value, which is a product of the number of the delay units and "n," to the deviation calculated by the deviation calculation unit.

3. The A/D converter circuit according to claim 1, wherein:
    the analog information is a value variable within a predetermined range; and
    the sampling period is set to satisfy the relational expression for any value of the analog information within the predetermined range with "n" being set to a predetermined value.

4. The A/D converter circuit according to claim 2, wherein;
    the analog information is a value variable within a predetermined range; and
    the sampling period is set to satisfy the relational expression for any value of the analog information within the predetermined range with "n" being set to a predetermined value.

* * * * *